US011586793B2

(12) United States Patent
Kalte et al.

(10) Patent No.: US 11,586,793 B2
(45) Date of Patent: Feb. 21, 2023

(54) METHOD FOR PRODUCING AN ASSOCIATION LIST

(71) Applicant: dSPACE digital signal processing and control engineering GmbH, Paderborn (DE)

(72) Inventors: Heiko Kalte, Paderborn (DE); Dominik Lubeley, Verl (DE)

(73) Assignee: dSPACE GmbH, Paderborn (DE)

( * ) Notice: Subject to any disclaimer, the term of this patent is extended or adjusted under 35 U.S.C. 154(b) by 1136 days.

(21) Appl. No.: 16/188,893

(22) Filed: Nov. 13, 2018

(65) Prior Publication Data

US 2019/0147129 A1    May 16, 2019

Related U.S. Application Data

(63) Continuation of application No. PCT/EP2017/060346, filed on May 2, 2017.

(30) Foreign Application Priority Data

May 10, 2016  (EP) .................................... 16168901

(51) Int. Cl.
*G06F 30/331* (2020.01)
*G06F 30/34* (2020.01)
(Continued)

(52) U.S. Cl.
CPC ........ *G06F 30/331* (2020.01); *G06F 9/30101* (2013.01); *G06F 11/3612* (2013.01);
(Continued)

(58) Field of Classification Search
CPC .... G06F 30/327; G06F 30/331; G06F 30/333; G06F 30/34; G06F 9/30101; G06F 11/3612
See application file for complete search history.

(56) References Cited

U.S. PATENT DOCUMENTS

| 9,235,425 B2 | 1/2016 | Kalte |
| 2014/0229723 A1 | 8/2014 | Kalte |

(Continued)

FOREIGN PATENT DOCUMENTS

| EP | 2765528 A1 | 8/2014 |
| EP | 3001318 A1 | 3/2016 |

OTHER PUBLICATIONS

International Search Report dated Jul. 21, 2017 in corresponding application PCT/EP2017/060346.
European Search Report dated Nov. 9, 2016 in corresponding application 16168901.3.
(Continued)

*Primary Examiner* — Jack Chiang
*Assistant Examiner* — Aric Lin
(74) *Attorney, Agent, or Firm* — Muncy, Geissler, Olds & Lowe, P.C.

(57) ABSTRACT

A method for creating an allocation map, wherein the allocation map is created based on an FPGA source code, wherein the source code uses at least a first signal at a first location, wherein at least a first register is mapped to the first signal, wherein in the allocation map, the first signal and the first register are listed as mapped to one another, wherein a second signal is used at a second location in the FPGA source code, wherein it is automatically detected that the value of the second signal can be determined from the value of the first signal according to a first calculation rule, wherein in the allocation map, the second signal, the first register and the first calculation rule are listed as mapped to one another.

11 Claims, 6 Drawing Sheets

| S110: Examine source code |
| S120: Determine first signal |
| S130: Determine or insert first register |
| S140: Determine second signal |
| S150: Determine calculation rule |
| S155: Determine or insert second register |
| S160: Store second signal, first register and calculation rule in allocation map |
| S170: Insert and configure readout mechanism |
| S180: Synthesize netlist from the source code with the inserted shadow registers |
| S190: Generate netlist from bitstream |
| S200: Load bitstream onto FPGA and execute function on FPGA |
| S210: Decouple shadow register at runtime and read out first register |

(51) Int. Cl.
*G06F 30/327* (2020.01)
*G06F 9/30* (2018.01)
*G06F 11/36* (2006.01)
*G06F 30/333* (2020.01)

(52) U.S. Cl.
CPC ............ *G06F 30/327* (2020.01); *G06F 30/34* (2020.01); *G06F 30/333* (2020.01)

(56) References Cited

U.S. PATENT DOCUMENTS

2015/0121319 A1    4/2015   Hutton et al.
2016/0085519 A1    3/2016   Kalte et al.

OTHER PUBLICATIONS

Tapp, Xilinx Configuration Readback Capture in Ultrascale FPGAs, Nov. 20, 2015 XAPP1230 (v1.1), pp. 1-24.
Hemmert et al, "Source Level Debugger for the Sea Cucumber Synthesizing Compiler", Dept of Eltrical and Computer Engineering, Brigham Young University, Proceedings of the 11$^{th}$ Annual IEEE Symposium on Field-Programmable Custom Computing Machines, pp. 1-10.
Nazanin Calagar et al, "Source-Level Debugging for FPGA High-Level Synthesis", Dept. of Electrical and Computer Engineering, University of Toronto, pp. 1-8.
Xilinx, "7 Series FPGAs Overview" Product Specification DS180 (v1.17) May 27, 2015, 1-17.
Fog, "4. Instruction Tables" Lists of Instruction latencies, throughputs and micro-operation breakdowns for Intel, AMD and VIA CPUs, Technical University of Denmark, Jan. 9, 2016.
Chinese Office Action dated Oct. 8, 2022 in corresponding application 201780015065.5.

- S110: Examine source code
- S120: Determine first signal
- S130: Determine or insert first register
- S140: Determine second signal
- S150: Determine calculation rule
- S155: Determine or insert second register
- S160: Store second signal, first register and calculation rule in allocation map
- S170: Insert and configure readout mechanism
- S180: Synthesize netlist from the source code with the inserted shadow registers
- S190: Generate netlist from bitstream
- S200: Load bitstream onto FPGA and execute function on FPGA
- S210: Decouple shadow register at runtime and read out first register

Fig. 6

METHOD FOR PRODUCING AN ASSOCIATION LIST

This nonprovisional application is a continuation of International Application No. PCT/EP2017/060346, which was filed on May 2, 2017, and which claims priority to European Patent Application No. 16168901.3, which was filed on May 10, 2016, and which are both herein incorporated by reference.

BACKGROUND OF THE INVENTION

Field of the Invention

The present invention relates to a method for creating an allocation map.

Description of the Background Art

The real-time simulation of complex, dynamic models places high demands on modern compute nodes due to the tight time constraints. In automotive hardware-in-the-loop simulations (HIL), models are mainly used where fast control loops need to be closed. This is the case with the simulation of in-cylinder pressure sensors, for example, which are playing an increasingly important role in reducing fuel consumption or exhaust gas emissions. However, short cycle periods and low latencies are also indispensable for controlled systems that are highly dynamic, such as electric motors. These systems can hardly be implemented anymore with CPU-based simulations.

Field Programmable Gate Arrays (FPGAs) can support compute nodes in real-time simulation by taking over the computation of dynamic parts of a model. Because of the high flexibility and the possibility of processing signals in parallel, using FPGAs also makes it easy to meet hard real-time requirements. The FPGAs can serve as hardware accelerators for CPUs of compute nodes. Accordingly, for example, very dynamic parts of the environment model are outsourced to the FPGA, so that sufficiently precise and fast response times for the control unit remain ensured. An FPGA netlist is typically generated based on an FPGA model in a hardware description language in a build process.

The models of a controlled system are becoming increasingly complex due to increasing demands on accuracy, and thus, also difficult to handle. In the automotive HIL environment, such models are typically created using the MATLAB/Simulink toolset from The MathWorks Inc. Simulink provides a block-based view in the form of a block diagram of such models. In a block diagram, model parts can be combined to subsystems and linked to each other with signals. The data flow between these blocks is represented by signal lines.

An FPGA-based simulation can be modeled analogous to the CPU-based simulation in a block diagram using Simulink with the aid of the Xilinx System Generator (XSG) and dSPACE's FPGA programming blockset.

However, unlike CPU simulation, this model is not translated into an iterative programming language, but into an FPGA netlist that describes a customized digital circuit. The FPGA netlist may be translated into an FPGA configuration data stream.

The allocation map is used to read out the signal values during runtime of the FPGA. A netlist is first generated from the source code; then, the netlist is converted to a bitstream and the bitstream is loaded onto an FPGA. In this conversion, it is tracked which register of the FPGA is used by which register of the source code, that is, which signal of the source code is stored at runtime in which register of the FPGA. If the value of a specific signal is to be read out from the FPGA, the allocation map can be used to determine which register of the FPGA has to be read out. This reading process can be realized by means of various techniques. For example, the register can be read out using a readback interface; this is described in EP2765528A1. In this case, it is possible to read out both the registers which are used by the function described in the FPGA source code and registers which are used only for the purpose of storing the signal values for reading and which are of no significance for the function described in the FPGA source code. Alternatively, the registers can be systematically read out using an address decoder. Alternatively, the registers can be connected to a shift register chain and read out sequentially.

SUMMARY OF THE INVENTION

It is therefore an object of the present invention to provide a method for generating an allocation map.

In an exemplary embodiment the allocation map can be created based on an FPGA source code. The source code can use at least a first signal at a first location. At least a first register can be mapped to the first signal. In the allocation map, the first signal and the first register can be listed as mapped to each other. A second signal can be used at a second location in the FPGA source code. It can be automatically recognized that according to a first calculation rule, the value of the second signal can be determined from the value of the first signal. Also, in the allocation map, the second signal, the first register and the first calculation rule can be listed as mapped to each other.

An allocation map created by the method according to the invention is advantageous when reading out signal values at runtime. At runtime, the value of the first signal can be stored in the first register. At runtime, the signal value can be read out in various ways as described above. Due to the calculation rule, it is not necessary to read out a register which is mapped to the second signal. If the first signal value and the second signal value are to be read out, only the first register has to be read out, which saves time.

The allocation map according to the invention makes it unnecessary for a register to be mapped to the second signal. When the value of the second signal is to be read out, the first register mapped to the first signal is read out and the value of the second signal is determined according to the calculation rule from the read-out value of the first register. Since the second signal does not have to be stored in a register, one register can be omitted. Signal values can be determined that are not stored in a register in the FPGA at runtime.

The allocation map contains the allocations of signals, registers and calculation rules. Each object of the list thus contains at least three elements. The allocation map can therefore also be understood as an allocation table. For example, there can be one allocation per line. In the first column, the respective signal, in the second column, the allocated register, and in the third column, the calculation rule with which the signal is calculated from the register value.

The first signal and the second signal can be identical and the calculation rule is the identity.

Since the signals can be identical in this case, their value at runtime is also identical. When determining the value of the second signal, therefore, the first signal value can be adopted.

The second signal can have a subset of the bits of the first signal and the allocation rule defines the bits of the first signal which describe the value of the second signal.

In this case, when determining the value of the second signal, only those bits defined by the allocation rule may be used. The other bits are discarded. If the first signal value is not required, the unneeded bits do not need to be read out.

The second signal can be connected to the first signal only by means of one or more bit-preserving arithmetic operations.

A bit-preserving arithmetic operation can be understood to mean, for example, that the values of a sequence of bits do not change; the bit sequence is merely shifted, this is also called shifting, or, interpreted differently, this is also called casting.

The second signal can be connected to the first signal by one or more bit-changing arithmetic operations.

To determine the second signal value, the value of the first signal is read out and the bit-changing arithmetic operation is reproduced.

The bit-changing arithmetic operation can output the arithmetic result at the same clock rate.

In order to determine the signal value of the second signal, the arithmetic operations should be reproduced after the first signal value has been read out from the register of the FPGA. If the result of the arithmetic operation is at the same clock rate, by reproducing the arithmetic operation, the first signal value and the second signal value are known at the same clock rate. This is advantageous because often, the goal is to create a consistent image of many variables in order to determine the state of the FPGA.

The bit-changing arithmetic operation can be a combinational logic operation.

Combinational logic operations which have no clock delay, i.e., where the results are at the same clock rate, are, for example: Logic operations (NOT, AND, NAND, OR, NOR, XOR); Lookup table operations; and/or Elementary arithmetic operations without pipeline stages (SUM, SUBTRACT, . . . ).

Analogous to the procedure for bit-preserving arithmetic operations, the results of these bit-changing arithmetic operations can also be determined by means of references to the input variables.

The bit-changing arithmetic operation can offset the first signal against a third signal, wherein a third register is mapped to the third signal, wherein in the allocation map, the third register is additionally mapped to the first signal, wherein the first calculation rule specifies how the value of the second signal can be calculated from the value of the first signal and the value of the third signal.

Generally, in an arithmetic operation having a plurality of inputs, when each input signal is stored in a register, the output signal (s) may be determined from the values of the input signals. The output signals do not have to be read out. An arithmetic operation may also be composed of a plurality of smaller arithmetic operations. For example, an addition of two signal values, followed by multiplication of the sum by a third value, can be regarded as an arithmetic operation with three input signals and one output signal.

The third register is used at runtime to store the value of the third signal. At runtime, the value of the first signal can then be read out from the first register and the value of the third signal can be read out from the third register. By recalculating the bit-changing arithmetic operation, the value of the second signal can then be determined without the value of the second signal having to be read out.

A second register can be mapped to the second signal in the FPGA source code, wherein in addition to the first register and the calculation rule, the second register is listed in the allocation map as mapped to the second signal.

The second register can provide an alternative method of determining the second signal value. The second signal value can then be determined on the basis of the allocation map either by reading out the first register and the calculation rule or by reading out the second register. By comparing the two results of the two methods of determination, information regarding errors can be found. Errors that may be noticed are, for example: a CPU error during the recalculation of the second signal value from the value of the first signal; a calculation error in the FPGA, whereby the calculation of the second value is faulty; and/or an error in implementing the source code on the FPGA.

The second register thus eliminates the above-described advantage of being able to omit a register, but error detection is made possible by means of the allocation rule.

The duration of the readout of the second register and the duration of the calculation of the second signal value from the first signal value can be estimated and, based on the estimates, the faster method is specified as the preferred method in the allocation map.

It is advantageous that at runtime, a decision can be made very quickly as to which method should be used.

If the registers are set up for readout using a shift register chain or an address decoder, the time required for reading out can be determined from the properties of the readout mechanism. If the registers are set up for readout using a readback interface, a good estimation of the readout duration is only possible after the creation of the netlist, once the bit locations of the values in the bit stream are known.

The time it takes to calculate the second signal value from the first signal value can be estimated, given a known processor, from the required processor commands and its execution time. Alternatively, the calculation duration may be determined empirically on the target processor or a comparable processor.

The FPGA source code can be implemented on an FPGA, the first register being read out of the FPGA at runtime, wherein the second signal value is determined from the allocation map by means of the calculation rule.

At runtime, the value of the first signal can be stored in the first register. At runtime, the signal value is read out. Possible techniques for reading out the register are given above. Due to the calculation rule, it is not necessary to read out a register which is mapped to the second signal. Only the first register is read out and the second value is determined by means of the calculation rule, which saves time. Since the second signal does not have to be stored in a register, one register can be omitted.

A second register can be mapped to the second signal in the FPGA source code, wherein in the allocation map, the second register is listed in addition to the first register and the calculation rule as mapped to the second signal, whereby the decision is automatically made at runtime whether the second signal value is read out from the second register or the second signal value is determined from the first signal value using the calculation rule.

It is advantageous that consideration can be given to the runtime conditions when determining the second signal value. If the first signal value is also to be determined, it is generally faster to calculate the second signal value from the first signal value than to read out the second signal value from the second register. If the first signal value is not to be determined, it is generally faster to read out the second signal value from the second register than to read out the first signal value from the first register and to calculate the second signal value therefrom.

In some development environments, multiple signals may be combined into a bus. For such combined signals, it is individually stipulated for each signal of a bus whether the signal value can be determined from other register values by means of a calculation rule. Accordingly, each signal is treated individually in the allocation map.

The invention further relates to a method for determining signal values from an FPGA at runtime, wherein an allocation map is used, wherein a first value of a first signal is read out at runtime from a first register, wherein in the allocation map the first signal, the first register, a second signal and a first calculation rule are listed as mapped to one another, wherein a second value of the second signal is determined from the first value using the first calculation rule.

An advantage of the method is that the value of the second signal does not have to be read out. In addition, values can be determined that are not stored in a register.

The allocation map for the determination of the signal values can be created according to the described method.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
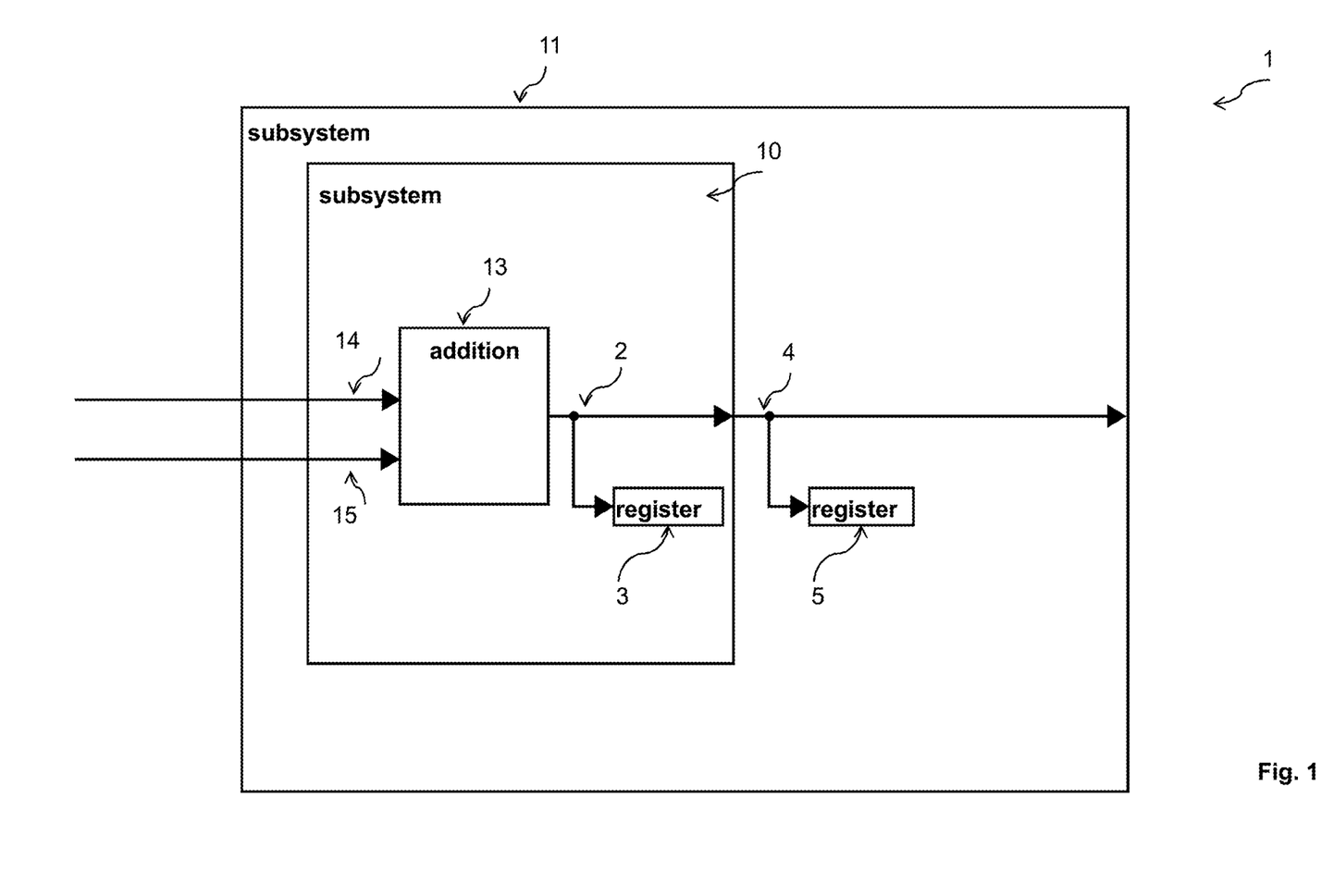
FIG. 1 illustrates a referencing of registers using the example of identical signals.

FIG. 1 shows a graphic FPGA source code 1 having two interleaved subsystems 10, 11. The first subsystem 10 includes a first logic block 13 and a second logic block 14. The first logic block 13 has two input signals 14, 15 and a first output signal 2. A first register 3 is mapped to the first output signal 2. The first register 3 is used at runtime to store the value of the first output signal 2 and to allow for a readout of the value at runtime.

The first subsystem 10 is embedded in a second subsystem 11. The first output signal 4 of the first subsystem 10 is identical to the first output signal 2 of the first logic block 13 within the first subsystem 10. When the allocation map is created, this is detected and the first register 3 within the first subsystem 10 is mapped to the first output signal 4 of the first subsystem. As the allocation rule between the first output signal 4 of the first subsystem 10 and the first register 2, the identity is specified in the allocation map. The second register 5, which is mapped to the first output signal 4 of the first subsystem 10, can therefore be omitted in the implementation. This conserves resources in the FPGA. Alternatively, the second register 5 can be implemented in the FPGA; then, the value of the first output signal 4 of the first subsystem 10 can be read out from the second register 5, which provides a way of detecting bugs at runtime.

Figure 2:
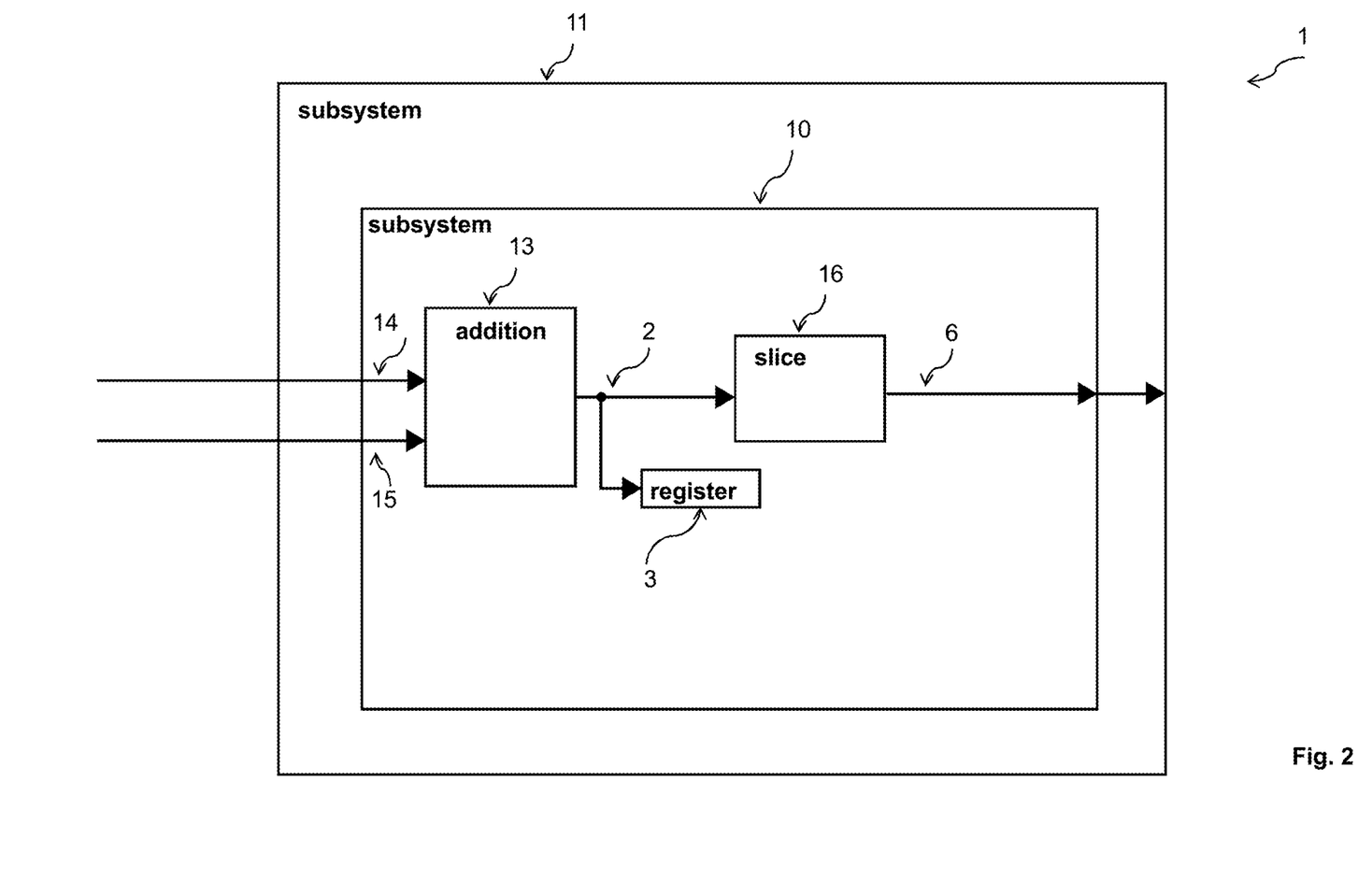
FIG. 2 illustrates a referencing of registers using the example of a bit reduction.

FIG. 2 shows another graphic FPGA source code 1. In the following, only the differences to FIG. 1 will be described. The first signal 2 is further processed in this embodiment to a second signal 6 by a so-called slice block 16. With a slice block 16, unneeded bits of a signal can be discarded. For example, the first signal 2 may be twenty bits, while the second signal 6 is only twelve bits, since only these twelve bits are needed. The second signal 6 as well as the second signal 2 of FIG. 1 could also be stored in a register.

Figure 3:
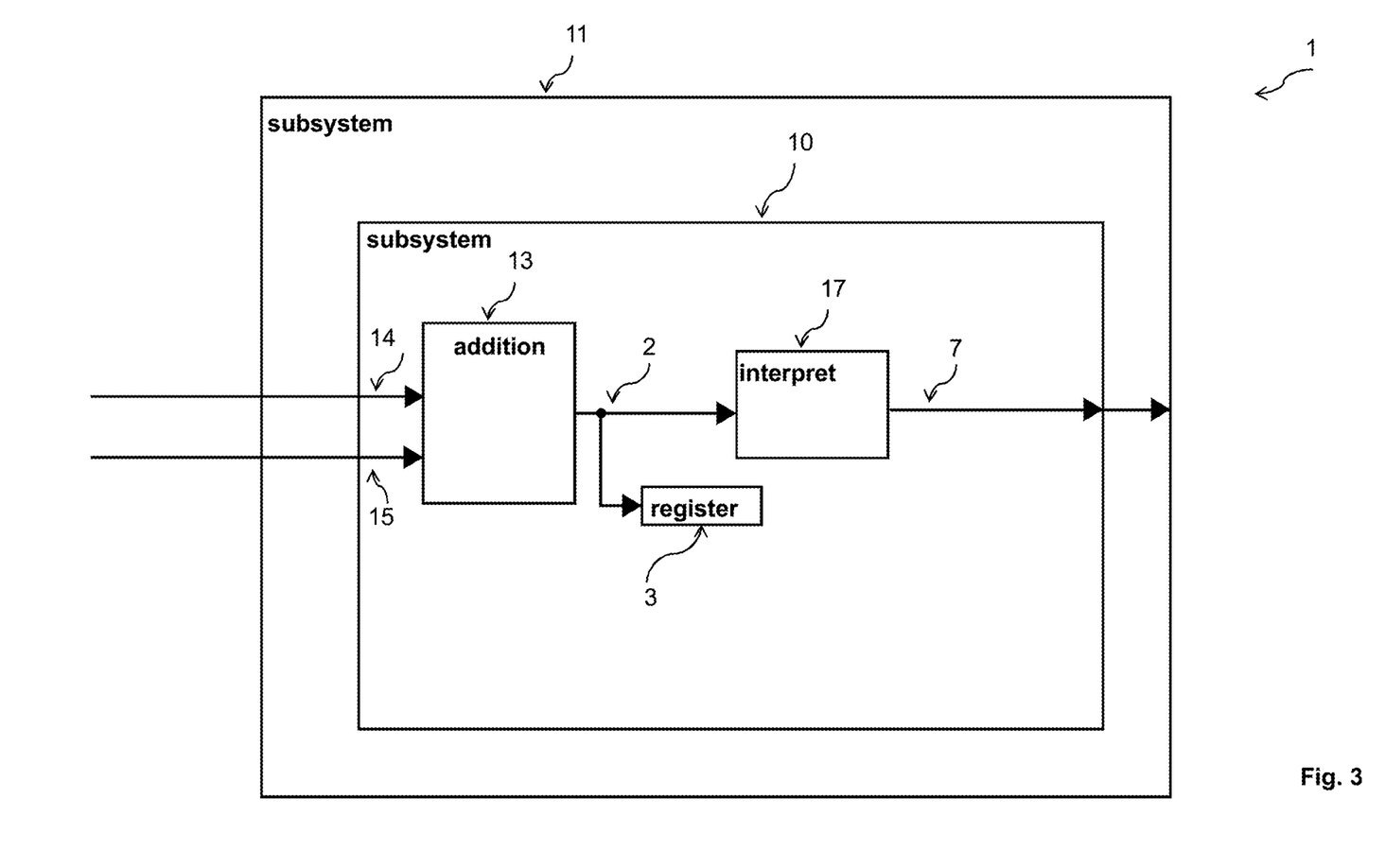
FIG. 3 illustrates a referencing of registers using the example of a bit-preserving arithmetic operation.

FIG. 3 shows another graphic FPGA source code 1. In the following, only the differences to FIG. 2 will be described. The first signal 2 is further processed in this embodiment by a so-called reinterpret block 17 to a second value 7. A reinterpret block 17 leaves the bit sequence of the signal unchanged, but affects the logical interpretation of the signal in the program. For example, the first signal 2 may represent a thirty-five bit integer, while the second signal 7 may be a floating point number of fifteen bits mantissa and ten bits exponent. The second signal 7 as well as the second signal 2 from FIG. 1 could be stored in a register.

Figure 4:
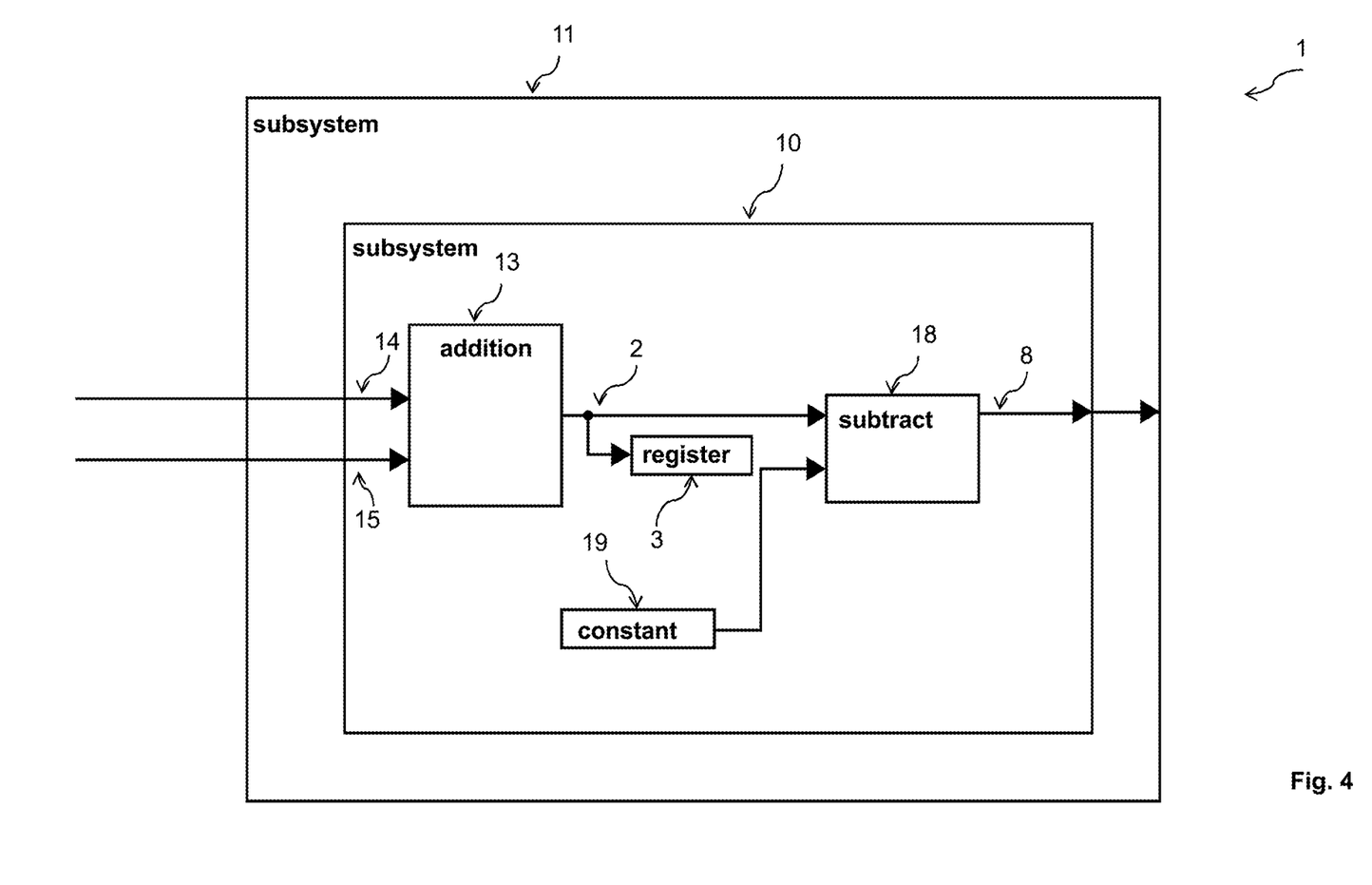
FIG. 4 illustrates a referencing of registers using the example of a bit-changing arithmetic operation.

FIG. 4 shows another graphic FPGA source code 1. In the following, only the differences to FIG. 2 will be described. The first signal 2 is further processed in this embodiment to a second value 8 by a so-called subtract block 18. The subtract block 18 subtracts a constant 19 from the first signal 2.

The value of the constant 19 does not have to be read out like the first value of the first signal 2 for determining the value of the second signal 8. The value of the constant 19 may be fixedly stored in the allocation map or otherwise, so that the value of the constant 19 can be accessed when calculating the value of the second signal 8. Alternatively, the value of the constant 19 may be read out once from the FPGA to rule out bugs in the FPGA build tool or hardware. Alternatively or additionally, the value of the constant 19 can be read out from the FPGA at predefined distances to prevent errors caused by operating conditions or hardware failure.

Figure 5:
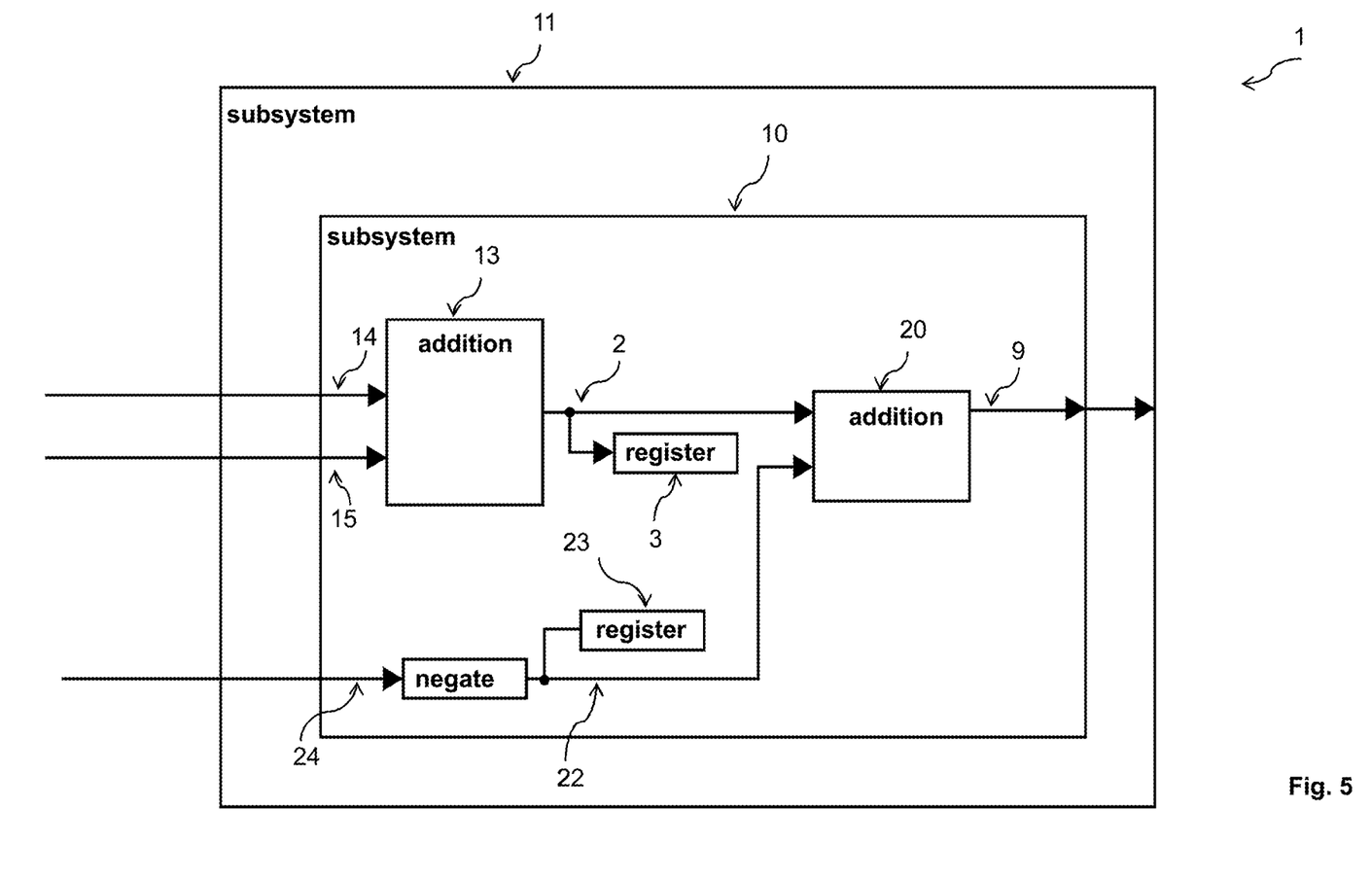
FIG. 5 illustrates a multiple referencing of registers using the example of a bit-changing arithmetic operation.

FIG. 5 shows another graphic FPGA source code 1. In the following, only the differences to FIG. 4 will be described. The first signal 2 is further processed in this embodiment to a second value 9 by a so-called addition block 20. The addition block 20 adds a third signal 22 to the first signal 2. A third register 23 is mapped to the third signal 23. The third register 23 is configured to store the value of the third signal 23 at runtime. At runtime, the value of the first signal 2 is read out from the first register 3 and the value of the third signal 22 is read out from the third register 23. The value of the second signal 9 can then be determined by adding the read-out values.

Figure 6:
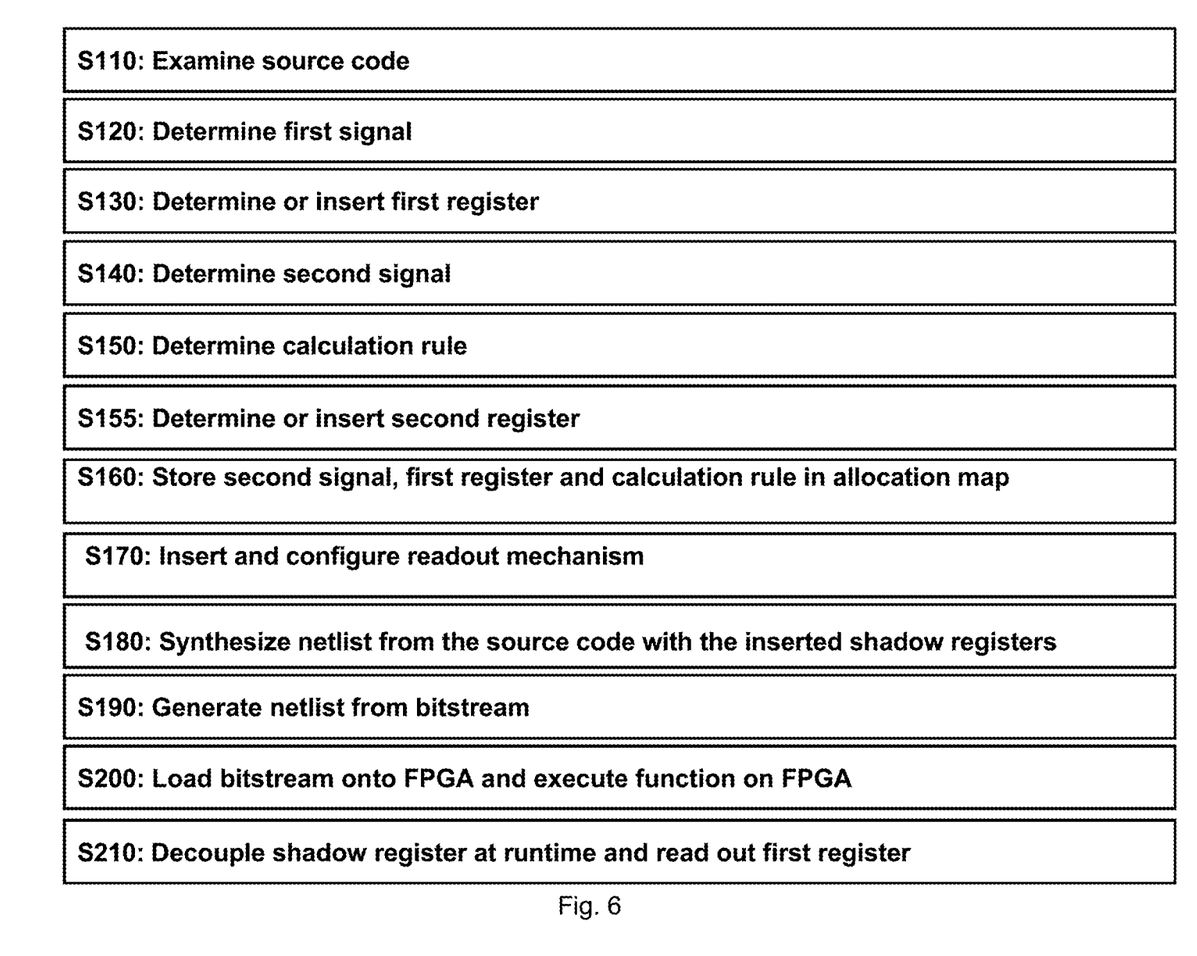
FIG. 6 illustrates the steps of a method according to the invention.

FIG. 6 shows the steps of a method according to the invention. Some steps are mandatory, other steps are optional. In a first obligatory step S110, the source code 1 is examined. The signals defined in the source code 1 are determined. In a second obligatory step S120, a first signal 2 in the source code 1 is determined. In a third obligatory step S130, it is determined in which register 3 the first signal 2, which is determined in the second step S120, is stored at runtime. If no first register 3 is mapped to the first signal 2, a first register 3 is inserted in the source code. In addition, for the first register 3, a decoupling mechanism can be inserted and configured in the source code, or the shadow register 10 can be connected to an already inserted decoupling mechanism. A decoupling mechanism may, for example, interrupt the clock line of the register or the enable signal of the register. The decoupling mechanism is capable of temporarily disconnecting the register from the associated signal at run time so that the value stored in the register is not updated during disconnection. Advantageously, a plurality of registers are connected to the same decoupling mechanism. This allows for the registers to be decoupled simultaneously and a consistent set of signal values to be stored in the registers. This is particularly advantageous if a second signal is to be calculated from the values of several signals. In a fourth obligatory step S140, a second signal 4, 6, 7, 8, 9 is determined. In a fifth obligatory step S150, the calculation rule is established, with which the value of the second signal 4, 6, 7, 8, 9, which is determined in the fourth step S140, can be determined from the value of the first signal 2, which is determined in the second step S120. The calculation rule is generally a transfer of the calculations defined in the source code 1 between the first signal 2 and the second signal 4, 6, 7, 8, 9. In a sixth optional step S155, it is determined in which register 5 the second signal 4, 6, 7, 8, 9 is stored. If such a second register 5 can be determined, it is used in the seventh step 160. If no such second register 5 can be determined, a second register 5 is inserted analogously to the first register 3 from the third step S130.

In an optional seventh step S160, a readout mechanism is inserted into the source code for the first register 3, which is determined in the third step S130, and/or for the second register, which is determined in the sixth step S155.

In an optional eighth step S170, a readout mechanism for the first register 3 is inserted and configured in the source code. The insertion and configuration of the readout mechanism can be formed, for example, of inserting an instruction for the implementation tools into the source code, stating that readout using a readback interface is to be enabled on the FPGA to which the netlist is to be loaded. If a readout of the first register 3 is possible without such a mechanism, then the insertion of a readout mechanism is not necessary. It can also be provided that a readout mechanism is inserted into the FPGA program created from the source code at a later stage in the method.

The second to eighth step can be repeated several times in order to map registers and calculation rules to a plurality of signals.

Preferably, the second to eighth steps are repeatedly processed automatically by an algorithm, wherein the algorithm systematically executes all signals defined in the source code.

In an optional ninth step S180, a netlist is synthesized from the source code. In an optional tenth step S190, the netlist generated in the ninth step S180 is converted into a bitstream, which can then be loaded onto an FPGA in an optional eleventh step S200 and executed there. During runtime of the FPGA, the first register 3, which is determined in the third step S130, can then be read out in an optional twelfth step S210. The value of the second signal 4, 6, 7, 8, 9 can then be determined from the read-out value using the calculation rule.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for determining signal values from a field programmable gate array (FPGA) at runtime of the FPGA, the method comprising:
creating an allocation map based on an FPGA source code;
processing, by the FPGA source code, at least a first signal at a first location;
mapping at least one first register to the first signal;
listing, in the allocation map, the first signal and the first register as being mapped to one another;
processing, a second signal at a second location in the FPGA source code, wherein it is automatically detected that a value of the second signal at a second location in the FPGA source code is determined from the value of the first signal in accordance with a first calculation rule;
listing, in the allocation map, the second signal, the first register, and the calculation rule as mapped to one another;
implementing the FPGA source code on the FPGA;
reading out a first value of the first signal at runtime of the FPGA from the first register; and
determining a second value of the second signal from the first value using the first calculation rule.

2. The method according to claim 1, wherein the first signal and the second signal are identical and the calculation rule is the identity.

3. The method according to claim 1, wherein the second signal includes a subset of the bits of the first signal and an allocation rule defines the bits of the first signal, which determine the value of the second signal.

4. The method according to claim 1, wherein the second signal is connected with the first signal only by one or more bit-preserving arithmetic operations.

5. The method according to claim 1, wherein the second signal is connected with the first signal by one or more bit-changing arithmetic operations.

6. The method according to claim 5, wherein the bit-changing arithmetic operation outputs the calculation result at the same clock rate.

7. The method according to claim 5, wherein the bit-changing arithmetic operation is a combinational logic operation.

8. The method according to claim 5, wherein the bit-changing arithmetic operation offsets the first signal against a third signal,
wherein a third register is mapped to the third signal,
wherein, in the allocation map, the third register is additionally mapped to the first signal, and
wherein a first calculation rule indicates how the value of the second signal is calculated from the value of the first signal and the value of the third signal.

9. The method according to claim 1, wherein a second register is mapped to the second signal in the FPGA source code, and
wherein, in the allocation map, in addition to the first register and the calculation rule, the second register is listed as mapped to the second signal.

10. The method according to claim 9, wherein the duration of the readout of the second register and the duration of calculating the second signal value from the first signal value is estimated from the first signal value, and based on the estimates, the faster method is specified as a method in the allocation map.

11. The method according to claim 1, wherein a second register is mapped to the second signal in the FPGA source code,
   wherein in the allocation map, in addition to the first register and the calculation rule, the second register is mapped to the second signal, and
   wherein a decision is automatically made at runtime whether the second signal value is read out of the second register or the second signal value is determined from the first signal value using the calculation rule.

* * * * *